(12) United States Patent
Kim et al.

(10) Patent No.: US 12,051,565 B2
(45) Date of Patent: Jul. 30, 2024

(54) SUBSTRATE TREATING APPARATUS AND IMPEDANCE MATCHING METHOD

(71) Applicant: SEMES CO., LTD., Cheonan-si (KR)

(72) Inventors: Young Kuk Kim, Cheonan-si (KR); Tae Hoon Jo, Seoul (KR); Goon Ho Park, Seoul (KR); Ja Myung Gu, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 93 days.

(21) Appl. No.: 17/527,128

(22) Filed: Nov. 15, 2021

(65) Prior Publication Data

US 2022/0157565 A1    May 19, 2022

(30) Foreign Application Priority Data

Nov. 16, 2020  (KR) .................. 10-2020-0152487

(51) Int. Cl.
    *H01J 37/32* (2006.01)
(52) U.S. Cl.
    CPC .... *H01J 37/32183* (2013.01); *H01J 37/3244* (2013.01)
(58) Field of Classification Search
    CPC .................. H01J 37/32183; H01J 37/3244
    See application file for complete search history.

(56) References Cited

U.S. PATENT DOCUMENTS

| | | | |
|---|---|---|---|
| 2007/0121267 A1* | 5/2007 | Kotani | H03H 7/40 361/85 |
| 2013/0002136 A1* | 1/2013 | Blackburn | H01J 37/32183 315/111.21 |
| 2016/0113103 A1* | 4/2016 | Van Zyl | H05H 1/46 315/111.21 |
| 2020/0343075 A1* | 10/2020 | Kim | H01P 5/026 |

FOREIGN PATENT DOCUMENTS

| | | |
|---|---|---|
| JP | 0955347 | 2/1997 |
| KR | 1020080113962 | 12/2008 |
| KR | 10-2013-0047532 | 5/2013 |
| KR | 10-2014-0070068 | 6/2014 |
| KR | 10-2017-0040001 | 4/2017 |
| KR | 1020190112180 | 10/2019 |

OTHER PUBLICATIONS

Office Action from Korean Intellectual Property Office dated Aug. 25, 2023.

* cited by examiner

*Primary Examiner* — Henry Luong

(57) ABSTRACT

Disclosed is an apparatus for treating a substrate. The apparatus includes: an RF power supply; a process chamber which performs plasma processing by using power applied from the RF power supply; and an impedance matching unit which is disposed between the RF power supply and the process chamber and performs matching, in which the RF power supply includes a first sensor measuring impedance in a direction of the process chamber and the impedance matching unit, and the impedance matching unit performs impedance matching by reflecting impedance measured in the RF power supply through the first sensor.

10 Claims, 5 Drawing Sheets

SUBSTRATE TREATING APPARATUS AND IMPEDANCE MATCHING METHOD

CROSS-REFERENCE TO RELATED APPLICATIONS

This application claims priority to and the benefit of Korean Patent Application No. 10-2020-0152487 filed in the Korean Intellectual Property Office on Nov. 16, 2020, the entire contents of which are incorporated herein by reference.

TECHNICAL FIELD

The present invention relates to a substrate treating apparatus and an impedance matching method.

BACKGROUND ART

In a recent plasma etching process, plasma control using multiple RF frequencies is general. When a chamber is made be vacuum, gas is injected and an RF voltage is applied, and then plasma is formed by accelerated electrons. In the process, in order for an RF power supply to provide maximum power to the chamber, an impedance matching unit is essentially positioned between the chamber and the RF power supply.

In the principle of impedance matching in the impedance matching unit, impedance ($Z_L(t)=R+jX$) of a load terminal that changes in real time according to the plasma state is measured by a sensor 21 located at the output side of the impedance matching unit and an internal circuit is controlled so that the measured impedance becomes the same as impedance of an input terminal. In general, in order to minimize an impedance change between the impedance matching unit and the process chamber, the impedance matching unit and the process chamber may be attached to each other. Further, in order to reduce an interference effect between the RF power supply and the impedance matching unit, a cable corresponding to a length (about several tens of meters) of a half wavelength of the RF frequency may be selected and connected.

A configuration of an existing substrate treating apparatus is illustrated in FIG. 3.

However, the problems generated by the existing substrate treating apparatus are as follows.

A cable corresponding to the half-wavelength of the RF frequency of the RF power supply is not produced, so that an error in matching occurs. Therefore, when a commercial cable is used, the impedance deviation occurring needs to be additionally corrected. Further, when equipment is set up, there may be a problem in that the disposition of the cable is changed according to a position and space or the cable is bent when the equipment is set up. In particular, when the disposition of the cable is changed or the cable is bent, inductance is changed according to the shape of the cable. In this case, there is a problem in that it is actually impossible to evaluate and test the substrate treating apparatus at the product release stage.

That is, in the configuration of the existing substrate treating apparatus illustrated in FIG. 3, even though the maximum power transmission condition $Z_G=Z_m$ is satisfied in the impedance matching unit and the process chamber end through the impedance matching, the total impedance considering the impedance of the cable of about several tens of meters is $Z_T(x,t)=50+Z_c(x)\neq Z_G$, so that power reflection in the direction of the RF power supply and the like is generated. Further, with the recent development of the etching technology, demanded power of the RF power supply is tens of thousands of watts, so the effect of interference caused by the cable is further increasing. The interference effect causes severe effects, such as etching efficiency decrease and an operation error of the RF power supply.

Accordingly, when the impedance matching is performed by focusing only the impedance matching between the impedance matching unit and the process chamber in the related art, there is a problem in that $Z_T$ that is the actual total impedance viewed from the RF power supply does not satisfy the maximum power transmission condition $Z_G=Z_T$.

SUMMARY OF THE INVENTION

The present invention has been made in an effort to provide an apparatus and a method capable of more accurately matching impedance compared to the related art.

The problem to be solved by the present invention is not limited to the above-mentioned problems. The problems not mentioned will be clearly understood by those skilled in the art from the descriptions below.

An exemplary embodiment of the present invention provides an apparatus for treating a substrate.

The apparatus includes: an RF power supply; a process chamber containing plasma generated by using power applied from the RF power supply; and an impedance matching unit which is disposed between the RF power supply and the process chamber and performs impedance matching between the RF power supply and the process chamber containing the plasma, the RF power supply including a first sensor measuring a first impedance in a direction of the process chamber and the impedance matching unit, and the impedance matching unit performs the impedance matching by reflecting the first impedance measured in the RF power supply through the first sensor.

According to the exemplary embodiment, the impedance matching unit may include a second sensor measuring a second impedance in a direction of the process chamber. The impedance matching unit performs the impedance matching by further reflecting the second impedance.

According to the exemplary embodiment, the impedance matching unit may include a third sensor measuring a third impedance in a direction of the RF power supply. The impedance matching unit performs the impedance matching by further reflecting the third impedance.

According to the exemplary embodiment, the apparatus for treating a substrate further includes a cable connecting the RF power supply and the impedance matching unit with each other. The impedance matching unit may perform primary impedance matching by using a value measured by the second sensor so that the impedance matching unit has a first matching impedance, and perform secondary impedance matching to compensate for cable impedance by using the value measured by the first sensor so that the first matching impedance of the impedance matching unit is adjusted to a second matching impedance.

According to the exemplary embodiment, the apparatus for treating a substrate further includes a cable connecting the RF power supply and the impedance matching unit with each other. The impedance matching unit may perform primary impedance matching by using a value measured by the second sensor so that the impedance matching unit has a first matching impedance, and perform secondary impedance matching to compensate for cable impedance by using the value measured by the first sensor and a value measured by the third sensor so that the first matching impedance of the impedance matching unit is adjusted to a second matching impedance.

According to the exemplary embodiment, the impedance matching unit may perform the impedance matching to transfer a maximum power to the process chamber.

According to the exemplary embodiment, the RF power supply may be provided in plurality, and the impedance matching unit may perform the matching between each of the plurality of RF power supplies and the process chamber.

Another exemplary embodiment of the present invention provides an apparatus for treating a substrate.

The apparatus includes: an RF power supply; a process chamber containing plasma generated by using power applied from the RF power supply; and an impedance matching unit which is disposed between the RF power supply and the process chamber and performs impedance matching between the RF power supply and the process chamber containing the plasma. The impedance matching unit includes a second sensor measuring impedance in a direction of the process chamber and a third sensor measuring impedance in a direction of the RF power supply.

According to the exemplary embodiment, the impedance matching unit may perform primary impedance matching by using a value measured by the second sensor so that the impedance matching unit is set to have first matching impedance, and perform secondary impedance matching by using a value measured by the third sensor so that the first matching impedance of the impedance unit is adjusted to second matching impedance.

According to the exemplary embodiment, the apparatus for treating the substrate includes a cable connecting the RF power supply and the impedance matching unit with each other. The impedance matching unit may calculate impedance of the cable based on the value measured by the third sensor and the first matching impedance of the RF power supply which was set in the primary impedance matching.

According to the exemplary embodiment, the secondary impedance matching may be performed by considering the impedance of the cable.

According to the exemplary embodiment, the impedance matching unit may perform the impedance matching in a range satisfying a maximum power transmission condition.

According to the exemplary embodiment, the RF power supply may be provided in plurality, and the impedance matching unit may perform the matching between each of the plurality of RF power supplies and the process chamber.

An exemplary embodiment of the present invention provides a method of performing impedance matching through an impedance matching unit connected between an RF power supply and a process chamber in a substrate treating apparatus that performs plasma processing in the process chamber by using power applied from the RF power supply.

The method may include: measuring, by the impedance matching unit, impedance of the process chamber side; performing primary impedance matching by using impedance of the process chamber side; and performing secondary impedance matching by using an additionally measured impedance value.

According to the exemplary embodiment, the performing of the secondary impedance matching by using the additionally measured impedance value may include measuring an impedance value viewed from the RF power supply.

According to the exemplary embodiment, the performing of the secondary impedance matching by using the additionally measured impedance value may include performing the impedance matching so as to correct a difference between the impedance value viewed from the RF power supply and a result value of the primary impedance matching.

According to the exemplary embodiment, the performing of the secondary impedance matching by using the additionally measured impedance value may include measuring, by the impedance matching unit, an impedance value facing the RF power supply.

According to the exemplary embodiment, the method may further include calculating, by the impedance matching unit, impedance of a cable connecting the impedance matching unit and the RF power supply by using the impedance value facing the RF power supply and previously measured impedance of the RF power supply.

According to the exemplary embodiment, the impedance matching may be performed by considering the impedance value of the cable.

According to the exemplary embodiment, the impedance matching unit may perform the impedance matching in a range satisfying a maximum power transmission condition.

According to the present invention, there is an effect that it is possible to more accurately match impedance compared to the related art.

The effect of the present invention is not limited to the foregoing effects. Those skilled in the art may clearly understand non-mentioned effects from the present specification and the accompanying drawings.

DETAILED DESCRIPTION

Figure 1A:
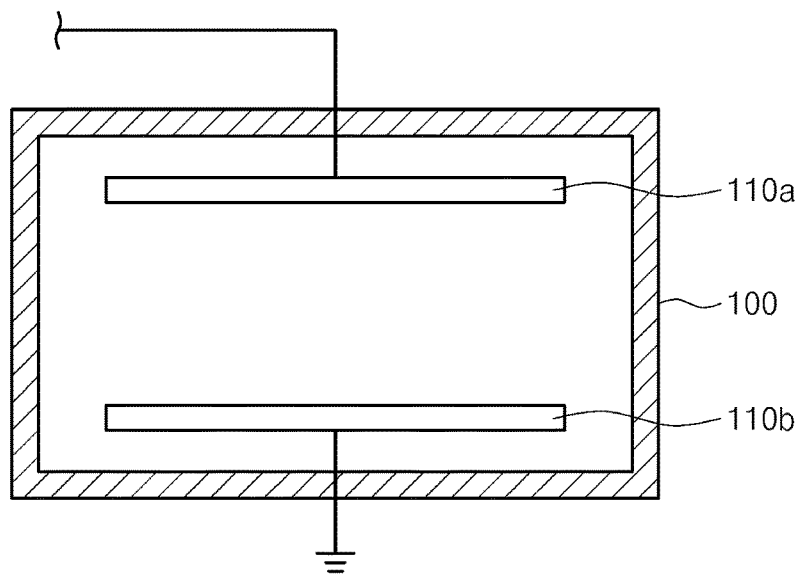
FIGS. 1A and 1B are diagrams illustrating a schematic configuration of a chamber according to an exemplary embodiment of the present invention.

Hereinafter, an exemplary embodiment of the present invention will be described more fully hereinafter with reference to the accompanying drawings, in which exemplary embodiments of the invention are shown. However, the present invention can be variously implemented and is not limited to the following embodiments. In the following description of the present invention, a detailed description of known functions and configurations incorporated herein is omitted to avoid making the subject matter of the present invention unclear. In addition, the same reference numerals are used throughout the drawings for parts having similar functions and actions.

Unless explicitly described to the contrary, the word "comprise" and variations such as "comprises" or "comprising", will be understood to imply the inclusion of stated elements but not the exclusion of any other elements. It will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance.

Singular expressions used herein include plurals expressions unless they have definitely opposite meanings in the context. Accordingly, shapes, sizes, and the like of the elements in the drawing may be exaggerated for clearer description.

Figure 1B:
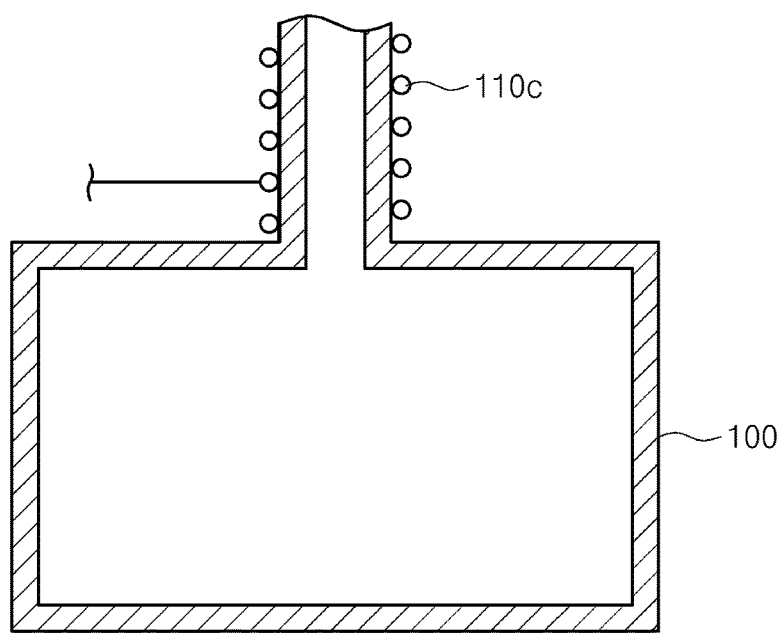

FIGS. 1A and 1B are diagrams illustrating a schematic configuration of a chamber according to an exemplary embodiment of the present invention.

As illustrated in FIGS. 1A and 1B, a plasma chamber 100 may include electrodes 110a and 110b to which an RF signal is applied. The electrodes 110a and 110b may transfer electric energy to the chamber so that gas introduced to the chamber is ionized and is changed to a plasma state. The electrodes 110a and 110b illustrated in FIG. 1A are an example of a Capacitively Coupled Plasma (CCP) source in which two electrode plates are disposed so as to face each other inside the chamber. The CCP source may transfer electric energy to electrons of the gas introduced into the chamber by using capacitor electric field. The CCP source may have the form in which each of the two electrode plates is connected with the RF power supply, but depending on an exemplary embodiment, the RF power supply may also be connected only to the upper electrode plate between the two electrode plates. An electrode 110c illustrated in FIG. 1B represents an example of an Inductively Coupled Plasma (ICP) formed of an induction coil wound outside the chamber 100. In the ICP source, a plasma generating device is separately coupled to the upper portion of the chamber, to change gas introduced into the chamber to a plasma state and provide the plasma to the chamber in a downstream method.

Figure 2:
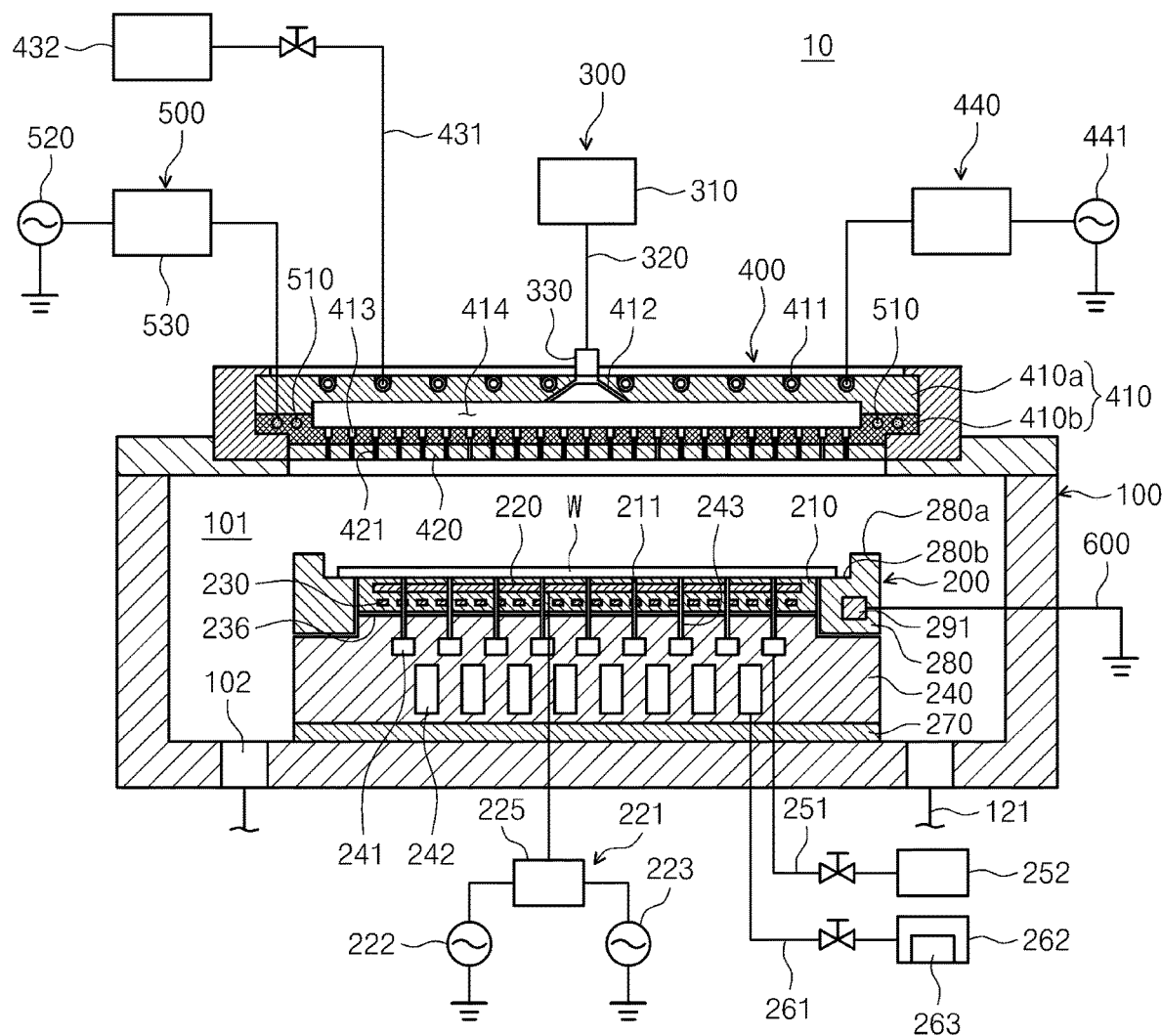
FIG. 2 is a diagram illustrating a configuration of a substrate treating apparatus according to an exemplary embodiment of the present invention.

FIG. 2 is a diagram illustrating a configuration of a substrate treating apparatus according to an exemplary embodiment of the present invention. FIG. 2 illustrates an example of the case where the CCP source is used in the exemplary embodiment of FIG. 1.

Referring to FIG. 2, a substrate treating apparatus 10 treats a substrate W by using plasma. For example, the substrate treating apparatus 10 may perform an etching process on the substrate W. The substrate treating apparatus 10 may include the chamber 100, a substrate support unit 200, a gas supply unit 300, a plasma generating unit 400, and a heating unit 500.

The chamber 100 is formed with a space 101 therein. The internal space 101 is provided as a space in which plasma process processing is performed on the substrate W. The plasma processing for the substrate W includes an etching process. An exhaust hole 102 is formed in a bottom surface of the chamber 100. The exhaust hole 102 is connected with an exhaust line 121. Reaction by-product generated during the process and gas staying inside the chamber 100 may be discharged to the outside through the exhaust line 121. By the exhaust process, the internal space 101 of the chamber 100 is decompressed to a predetermined pressure.

The substrate support unit 200 is positioned inside the chamber 100. The substrate support unit 200 supports the substrate W. The substrate support unit 200 includes an electrostatic chuck which adsorbs and fixes the substrate W by using electrostatic force. The substrate support unit 200 may include a dielectric plate 210, a lower electrode 220, a heater 230, a support plate 240, and an insulating plate 270.

The dielectric plate 210 is located at an upper end of the substrate support unit 200. The dielectric plate 210 is provided as a disk-shaped dielectric body. The substrate W may be placed on an upper surface of the dielectric plate 210. The upper surface of the dielectric plate 210 has a smaller radius than that of the substrate W. Accordingly, an edge region of the substrate W is located at an external side of the dielectric plate 210. A first supply flow path 211 is formed in the dielectric plate 210. The first supply flow path 211 is provided from the upper surface to the lower surface of the dielectric plate 210. The plurality of first supply flow paths 211 is formed while being spaced apart from each other, and is provided as a passage through which a heat transfer medium is supplied to the bottom surface of the substrate W. A separate electrode for adsorbing the substrate W to the dielectric plate 210 may be embedded in the dielectric plate 210. A direct current may be applied to the electrode. By the applied current, electrostatic force acts between the electrode and the substrate, and the substrate W may be adsorbed to the dielectric plate 210 by the electrostatic force.

The lower electrode 220 is connected with a lower power supply unit 221. The lower power supply unit 221 applies power to the lower electrode 220. The lower power supply unit 221 includes lower RF power supplies 222 and 223 and a lower impedance matching unit 225. The plurality of lower RF power supplies 222 and 223 may be provided as illustrated in FIG. 1, or optionally only one lower RF power supply may also be provided. The lower RF power supplies 222 and 223 may adjust plasma density. The lower RF power supplies 222 and 223 mainly adjust ion bombardment energy. The lower RF power supplies 222 and 223 may generate frequency power of 2 Mhz and 13.56 Hz, respectively. The lower impedance matching unit 225 is electrically connected with the lower RF power supplies 222 and 223, and matches frequency power of different sizes and applies the matched frequency power to the lower electrode 220.

The heater 230 is electrically connected with an external power supply (not illustrated). The heater 230 generates heat by resisting current applied from the external power supply. The generated heat is transferred to the substrate W through the dielectric plate 210. By the heat generated in the heater 230, the substrate W is maintained at a predetermined temperature. The heater 230 includes a spiral-shaped coil. The heaters 230 may be embedded in the dielectric plate 210 at a constant interval.

The support plate 240 is located in the lower portion of the dielectric plate 210. The bottom surface of the dielectric plate 210 and an upper surface of the support plate 240 may be bonded by an adhesive 236. The support plate 240 may be made of aluminum. The upper surface of the support plate 240 may be stepped so that a center region is higher than an edge region. The center region of the upper surface of the support plate 240 has an area corresponding to the bottom surface of the dielectric plate 210, and is bonded to the bottom surface of the dielectric plate 210. A first circulation flow path 241, a second circulation flow path 242, and a second supply flow path 243 are formed in the support plate 240.

The first circulation flow path 241 is provided as a passage in which a heat transfer medium is circulated. The first circulation flow path 241 may be formed in a spiral shape inside the support plate 240. Otherwise, the first circulation flow paths 241 may be arranged such that the ring-shaped flow paths having different radii have the same center. The first circulation flow paths 241 may communicate with each other. The first circulation flow paths 241 are formed at the same height.

The second circulation flow path 242 is provided as a passage in which a cooling fluid is circulated. The second circulation flow path 242 may be formed in a spiral shape inside the support plate 240. Otherwise, the second circulation flow paths 242 may be arranged such that the ring-shaped flow paths having different radii have the same center. Each of the second circulation flow paths 242 may communicate with each other. The second circulation flow path 242 may have a larger cross-sectional area than that of the first circulation flow path 241. The second circulation flow paths 242 are formed at the same height. The second circulation flow paths 242 may be positioned under the first circulation flow paths 241.

The second supply flow path 243 is extended upward from the first circulation flow path 241, and is provided to the upper surface of the support plate 240. The second supply flow paths 243 are provided in a number corresponding to the number of first supply flow paths 211, and connect the first circulation flow paths 241 and the first supply flow paths 211.

The first circulation flow path 241 is connected with a heat transfer medium storage unit 252 through a heat transfer medium supply line 251. A heat transfer medium is stored in the heat transfer medium storage unit 252. The heat transfer medium includes inert gas. According to the exemplary embodiment, the heat transfer medium includes helium (He) gas. The helium gas is supplied to the first circulation flow path 241 through the supply line 251, and is supplied to the bottom surface of the substrate W by sequentially passing through the second supply flow path 243 and the first supply flow path 211. The helium gas serves as a medium by which the heat transmitted to the substrate W from the plasma is transmitted to the substrate support unit 200. Ion particles contained in the plasma are attracted by electric force formed in the substrate support unit 200 to move to the substrate support unit 200, and the ion particles perform an etching process while colliding with the substrate W in the moving process. In the process in which the ion particles collide with the substrate W, heat is generated in the substrate W. The heat generated in the substrate W is transferred to the substrate support unit 200 through the helium gas supplied to the space between the bottom surface of the substrate W and the upper surface of the dielectric plate 210. Accordingly, the substrate W may be maintained at a set temperature.

The second circulation flow path 242 is connected with a cooling fluid storage unit 262 through a cooling fluid supply line 261. A cooling fluid is stored in the cooling fluid storage unit 262. A cooler 263 may be provided inside the cooling fluid storage unit 262. The cooler 263 cools the cooling fluid to a predetermined temperature. Contrary to this, the cooler 263 may be installed on the cooling fluid supply line 261. The cooling fluid supplied to the second circulation flow path 242 through the cooling fluid supply line 261 cools the support plate 240 while circulating along the second circulation flow path 242. The cooling of the support plate 240 cools the dielectric plate 210 and the substrate W together to maintain the substrate W at a predetermined temperature.

The insulating plate 270 is provided to the lower portion of the support plate 240. The insulating plate 270 is provided in a size corresponding to the size of the support plate 240. The insulating plate 270 is positioned between the support plate 240 and the bottom surface of the chamber 100. The insulating plate 270 is made of an insulating material, and electrically insulates the support plate 240 and the chamber 100.

The edge ring 280 is disposed in the edge region of the substrate support unit 200. The edge ring 280 has a ring shape, and is disposed along a circumference of the dielectric plate 210. An upper surface of the edge ring 280 may be stepped so that an outer portion 280a is higher than an inner portion 280b. The inner portion 280b of the upper surface of the edge ring 280 is positioned at the same height as that of the upper surface of the dielectric plate 210. The inner portion 280b of the upper surface of the edge ring 280 supports the edge region of the substrate W positioned at the external side of the dielectric plate 210. The outer portion 280a of the edge ring 280 is provided so as to surround the edge region of the substrate W. The edge ring 280 expands an electric field forming region so that the substrate W is positioned at the center of the region in which the plasma is formed. Accordingly, the plasma is uniformly formed over the entire region of the substrate W, so that each region of the substrate W may be uniformly etched.

The gas supply unit 300 supplies the process gas to the chamber 100. The gas supply unit 300 includes a gas storage unit 310, a gas supply line 320, and a gas inflow port 330. The gas supply line 320 connects the gas storage unit 310 and the gas inflow port 330, and supplies the process gas stored in the gas storage unit 310 to the gas inflow port 330. The gas inflow port 330 is connected with gas supply holes 412 formed in an upper electrode 410.

The plasma generating unit 400 excites the progress gas staying inside the chamber 100. The plasma generating unit 400 includes the upper electrode 410, a distribution plate 420, and an upper power supply unit 440.

The upper electrode 410 is provided in a disk shape, and is positioned above the substrate support unit 200. The upper electrode 410 includes an upper plate 410a and a lower plate 410b. The upper plate 410a is provided in a disk shape. The upper plate 410a is electrically connected with an upper RF power supply 441. The upper plate 410a applies first RF power generated in the upper RF power supply 441 to the process gas staying inside the chamber 100 to excite the process gas. The process gas is excited and is converted to a plasma state. The bottom surface of the upper plate 410a is stepped so that the center region is higher than the edge region. Gas supply holes 412 are formed in the center region of the upper plate 410a. The gas supply holes 412 are connected with the gas inflow port 330, and supply the process gas to a buffer space 414. A cooling flow path 411 may be formed inside the upper plate 410a. The cooling flow path 411 may be formed in a spiral shape. Otherwise, the cooling flow paths 411 may be disposed so that the ring-shaped flow paths having different radii have the same center. The cooling flow path 411 is connected with the cooling fluid storage unit 432 through the cooling fluid supply line 431. The cooling fluid storage unit 432 stores the cooling fluid. The cooling fluid stored in the cooling fluid storage unit 432 is supplied to the cooling flow path 411 through the cooling fluid supply line 431. The cooling fluid circulates the cooling flow path 411 and cools the upper plate 410a.

The lower plate 410b is located under the upper plate 410a. The lower plate 410b is provided in a size corresponding to that of the upper plate 410a, and is positioned while facing the upper plate 410a. An upper surface of the lower plate 410b is stepped so that the center region is lower than the edge region. The upper surface of the lower plate 410b and the bottom surface of the upper plate 410a are combined with each other to form the buffer space 414. The buffer space 414 is provided as a space in which the gas supplied through the gas supply holes 412 is temporarily stayed before being supplied into the chamber 100. The gas supply holes 413 are formed in the center region of the lower plate 410b. The plurality of gas supply holes 413 is formed while being spaced apart from each other at a predetermined interval. The gas supply holes 413 are connected with the buffer space 414.

The distribution plate 420 is located under the lower plate 410b. The distribution plate 420 is provided in a disk shape. Distribution holes 421 are formed in the distribution plate 420. The distribution holes 421 are provided from the upper surface to the lower surface of the distribution plate 420. The distribution holes 421 are provided in a number corresponding to the number of gas supply holes 413, and are located corresponding to the positions of the gas supply holes 413. The process gas staying in the buffer space 414 is uniformly supplied into the chamber 100 through the gas supply holes 413 and the distribution holes 412.

The upper power supply unit 440 applies RF power to the upper plate 410a. The upper power supply unit 440 includes the upper RF power supply 441 and a matching circuit 442.

The heating unit 500 heats the lower plate 410b. The heating unit 500 includes a heater 510, a second upper power supply 520, and a filter 530. The heater 510 is installed inside the lower plate 410b. The heater 510 may be provided to the edge region of the lower plate 410b. The heater 510 may include a heating coil, and may be provided so as to surround the enter region of the lower plate 410b. The second upper power supply 520 is electrically connected with the heater 510. The second upper power supply 520 may generate direct-current power. Otherwise, the second upper power supply 520 may generate alternating-current power. Second frequency power generated in the second upper power supply 520 is applied to the heater 510, and the heater 510 heats by resisting the applied current. The heat generated in the heater 510 heats the lower substrate 410b, and the heated lower plate 410b heats the distribution plate 420 located under the lower plate 410b at a predetermined temperature. The lower plate 420 may be heated to 60° C. The filter 530 is electrically connected with the second upper power supply 520 and the heater 510 in a section between the second upper power supply 520 and the heater 510.

Figure 3:
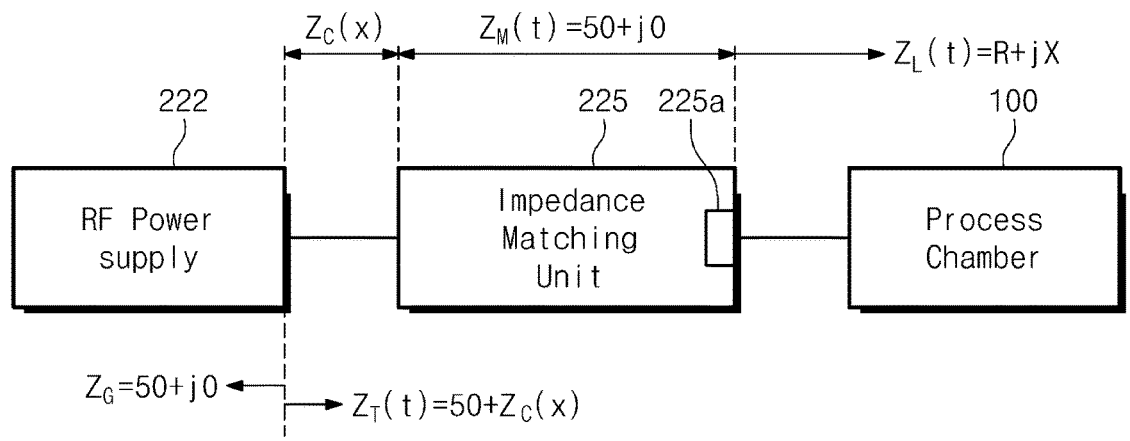
FIG. 3 is a block diagram illustrating a substrate treating apparatus in the related art.
Figure 4:
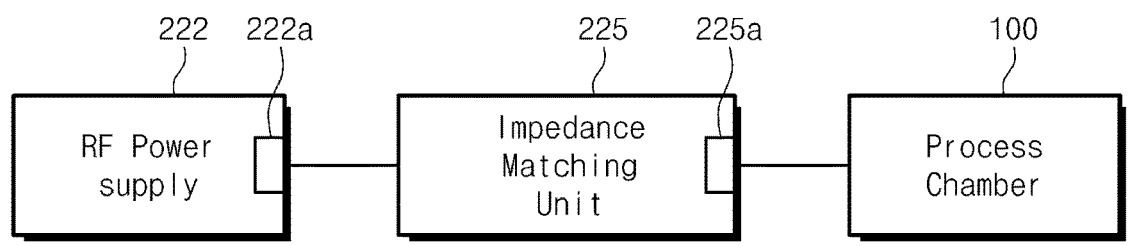
FIG. 4 is a block diagram illustrating a substrate treating apparatus according to an exemplary embodiment of the present invention.
Figure 5:
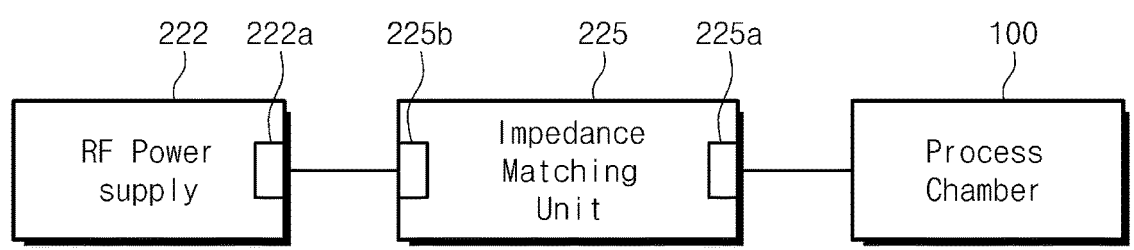
FIG. 5 is a block diagram illustrating a substrate treating apparatus according to an exemplary embodiment of the present invention.

FIGS. 3 to 5 are block diagrams illustrating substrate treating apparatuses according to exemplary embodiments of the present invention.

In FIGS. 3 to 5, the common characteristics will be first described, and each characteristic, except for the common characteristics, in each drawing will be described below.

Figure 6:
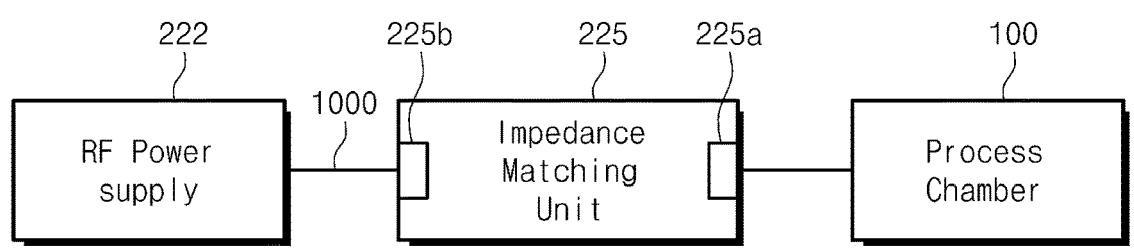
FIG. 6 is a block diagram illustrating a substrate treating apparatus according to an exemplary embodiment of the present invention.

A substrate treating apparatus 1 according to FIGS. 4 to 6 may include an RF power supply 222, an impedance matching unit 225, and a process chamber 100. The substrate treating apparatus 1 performs plasma process. Herein, the plasma process needs to be interpreted as a general meaning including all of the processes of treating a substrate by using plasma. For example, the plasma process may be a plasma deposition process, a plasma etching process, a plasma ashing process, and a plasma cleaning process. In the plasma process, plasma may be formed by applying high-frequency power to a source gas.

In the meantime, herein, a substrate needs to be interpreted as a general meaning including all of the substrates used for manufacturing a semiconductor device or a Flat Panel Display (FPD), and other products in which patterns are formed on a thin film.

The RF power supply 222 outputs high-frequency power. The transmission line connects the RF power supply 222 and the process chamber 100, and transmits high-frequency power to the process chamber 100 from the RF power supply 222. The process chamber 100 performs the plasma process by using the high-frequency power. The impedance matching unit 225 is provided on the transmission line, and matches impedance between the process chamber 100 and the RF power supply 222. According to the exemplary embodiment, the plurality of RF power supplies 222 may be provided like the exemplary embodiment of FIG. 2. The impedance matching unit 225 may perform matching between the plurality of RF power supplies 222 and 223 and the process chamber 100.

The RF power supply 222 outputs high-frequency power. Herein, the RF power supply 222 may output the high-frequency power in a pulse mode. The RF power supply 222 may output the high-frequency power at a specific frequency. For example, the RF power supply 222 may output the high-frequency power at a frequency, such as 2 Mhz, 13.56 Mhz, and 1000 Mhz.

The transmission line transmits the high-frequency power. The transmission line may connect the RF power supply 222 and the process chamber 100, thereby supplying the high-frequency power output by the RF power supply 222 to the process chamber 100.

The process chamber 100 may perform the plasma process by using the high-frequency power. The process chamber 100 may include a housing and a plasma generator. The housing provides a space in which the plasma process is performed. The plasma generator provides the housing with the plasma. The plasma generator may form plasma by applying the high-frequency power to the source gas. When the source gas is introduced to the process chamber 100, the plasma generator applies the high-frequency power to the introduced source gas, and thus, the source gas may be ionized and excited in a plasma state.

As the plasma generator, a Capacitively Coupled Plasma Generator (CCPG) may be used. The CCPG may include a plurality of electrodes positioned inside the housing.

The impedance matching unit 225 is provided on the transmission line which connects the RF power supply 222 and the process chamber 100, and matches impedance of the RF power supply 222 side and the process chamber 100 side.

When high-frequency power is transmitted while passing through a non-consumable circuit element, such as a capacitor or an inductor and the impedance of the transmitting end and the receiving end do not match, a phase difference is generated in the high-frequency power by the non-consumable circuit element. When the phase difference is generated, power transmission is delayed, and thus, a reflected wave is generated and reflected power is generated. The reflected power may degrade power transmission efficiency, and act as a factor making the transmission of high-frequency power non-uniform. In particular, when reflected power is generated when the high-frequency power is transmitted from the RF power supply 222 to the process chamber 100 through the transmission line, the power is non-uniformly transmitted, so that a deviation occurs in plasma density in the process chamber 100, thereby degrading yield of the substrate. Further, the reflected power is accumulated in the process chamber 100, arc discharge is caused in the process chamber 100, so that the substrate may also be directly damaged.

The impedance matching unit 225 may solve the problem by removing the reflected power by matching the impedance.

According to the exemplary embodiment, the impedance matching unit 225 may include an impedance measuring device, a reflected power measuring device, a controller, and a matching device. The impedance measuring device measures impedance of the process chamber 100.

The impedance of the process chamber 100 may be changed according to the change in the impedance of the plasma inside the process chamber 100 while the plasma process progresses. The impedance of the plasma is determined by various conditions, such as the type of source gas, internal pressure, and an internal temperature. The impedance measuring device may measure impedance of the process chamber 100, and transmit the measurement value to the controller. According to the exemplary embodiment, the impedance measuring device may be a second sensor 225a.

The reflected power measuring device measures reflected power by a reflected wave. The reflected power measuring device may be installed on the transmission line and measure reflected power, and transmit the measurement value to the controller.

The controller may receive the measurement values from the impedance measuring device and the reflected power measuring device and generate a control signal for compensating for the impedance, and transmit the generated control signal to the matching device. The control signal may be a digital signal, for example, an on/off signal. The controller may be implemented with a computer or a similar device thereof by using hardware, software, or a combination of hardware and software.

According to the implementation by hardware, the controller may be implemented with an Application Specific Integrated Circuits (ASICs), Digital Signal processors (DSPs), Digital Signal Processing Devices (DSPDs), Programmable Logic Devices (PLDs), Field Programmable Gate Arrays (FPGAs), processors, controllers, micro-controllers, microprocessors, or other electric devices for performing similar functions.

According to the implementation by software, the controller may be implemented with software codes according to one or a plurality of program languages or a software application. The software may be executed by the controller implemented by hardware. Further, the software may be transmitted to and installed in the hardware configuration described above from an external device, such as a server.

The matching device matches impedance of the RF power supply 222 side and the process chamber 100 side. The matching device may be implemented with an electric circuit formed of a resistor, a capacitor, an inductor, and other various circuit elements. The matching device may match impedance according to a control signal. The circuit elements of the matching device may be operated according to the control signal, and thus resistance, capacitance, inductance, and other electrical properties of the matching device may be adjusted, and accordingly, the matching device may match the impedance.

In each drawing below, each characteristic, except for the common characteristic, in the substrate treating apparatus will be described.

FIG. 4 is a block diagram illustrating a substrate treating apparatus according to an exemplary embodiment of the present invention.

Referring to FIG. 4, an RF power supply 222 of the substrate treating apparatus according to the exemplary embodiment may include a process chamber 100, and a first sensor 222a for measuring impedance in a direction of an impedance matching unit 225. Further, the impedance matching unit 225 of the substrate treating apparatus according to the exemplary embodiment may include a second sensor 225a for measuring impedance in a direction of the process chamber 100.

The impedance matching unit 225 according to the exemplary embodiment may perform impedance matching by reflecting the impedance measured by the RF power supply 222 through the first sensor 222a included in the RF power supply 222. The impedance matching unit 225 according to the exemplary embodiment may perform primary impedance matching by using the value measured by the second sensor 225a and perform secondary impedance matching that corrects a difference value by using the value measured by the first sensor 222a. The more detailed impedance matching method using the foregoing structure will be described below in the exemplary embodiment of FIG. 7.

FIG. 5 is a block diagram illustrating a substrate treating apparatus according to an exemplary embodiment of the present invention.

Referring to FIG. 5, an RF power supply of the substrate treating apparatus according to the exemplary embodiment may include a process chamber 100 and a first sensor 222a for measuring impedance in a direction of an impedance matching unit 225. Further, the impedance matching unit 225 of the substrate treating apparatus according to the exemplary embodiment may include a second sensor 225a for measuring impedance in a direction of the process chamber 100, and a third sensor 225b for measuring impedance in a direction of the RF power supply 222.

The exemplary embodiment is different from the exemplary embodiment of FIG. 4 in that the third sensor 225b for measuring impedance in the direction of the RF power supply 222 is additionally included.

The impedance matching unit 225 according to the exemplary embodiment of FIG. 5 may perform primary impedance matching by using the value measured by the second sensor 225a, and perform secondary impedance matching that corrects a difference value by using the value measured by the first sensor 222a and the value measured by the third sensor 225b. The more detailed impedance matching method using the foregoing structure will be described below in the exemplary embodiment of FIG. 7.

FIG. 6 is a block diagram illustrating a substrate treating apparatus according to an exemplary embodiment of the present invention.

Referring to FIG. 6, an impedance matching unit 225 of the substrate treating apparatus according to the exemplary embodiment may include a second sensor 225a for measuring impedance in a direction of a process chamber 100, and a third sensor 225b for measuring impedance in a direction of an RF power supply 222.

The exemplary embodiment of FIG. 6 is different from the exemplary embodiment of FIG. 4 or FIG. 5 in that the first sensor 222a included in the RF power supply 222 is not included.

The impedance matching unit 225 according to the exemplary embodiment of FIG. 6 may perform primary impedance matching by using the value measured by the second sensor 225a and perform secondary impedance matching by using the value measured by the third sensor 225b. In some embodiments, the impedance matching unit 225 according to the exemplary embodiment of FIG. 6 may calculate cable impedance of a cable 1000 by considering the value measured by the third sensor 225b and the previously measured impedance of the RF power supply 222 (i.e., the matching impedance of the RF power supply determined by the primary impedance matching between the impedance matching unit 225 and the process chamber 100 containing plasma), and perform secondary impedance matching by considering the calculated cable impedance to adjust the first matching impedance of the impedance matching unit 225 to second matching impedance. The cable 1000 may connect the RF power supply 222 to the impedance matching unit 225. The more detailed impedance matching method using the foregoing structure will be described below in the exemplary embodiment of FIG. 8.

Figure 7:
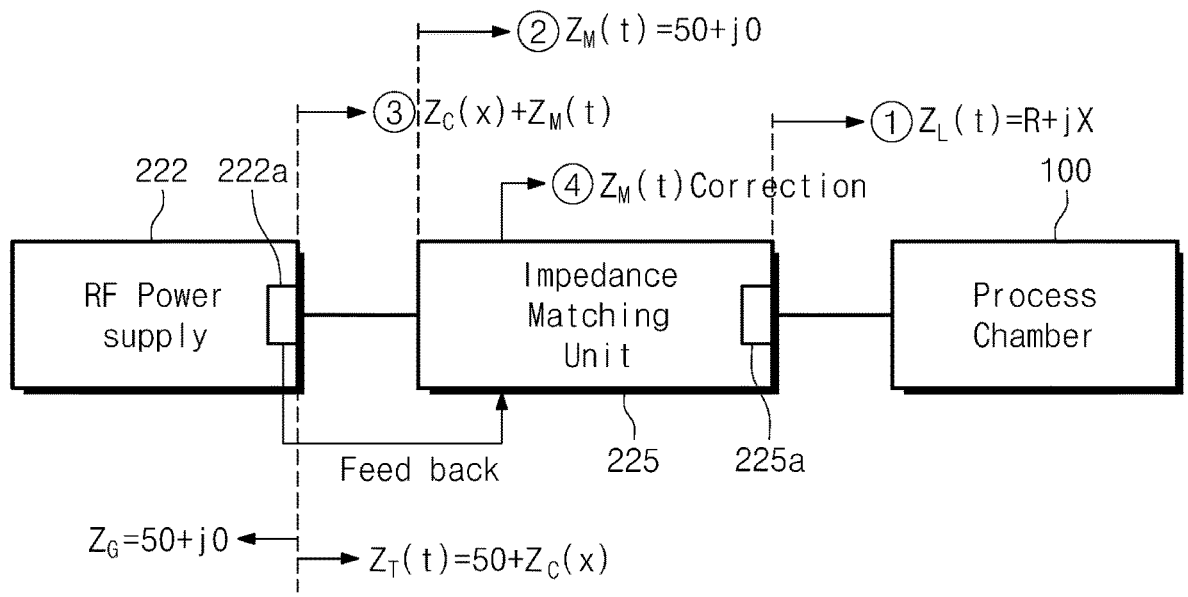
FIG. 7 is a diagram illustrating performance of impedance matching through the substrate treating apparatus according to the exemplary embodiment of FIG. 4.

FIG. 7 is a diagram illustrating performance of the impedance matching through the substrate treating apparatus according to the exemplary embodiment of FIG. 4.

According to FIG. 7, an impedance matching method according to an exemplary embodiment of the present invention may measure actual total impedance $Z_T$ viewed from the RF power supply 222 through the first sensor 222a in real time, transmit the measured total impedance to the impedance matching unit 225, and correct target impedance of the impedance matching unit 225 so as to satisfy the maximum power transmission condition $Z_G=Z_T$.

The present invention is directed to the system which measures impedance, which is changed according to various factors, between the RF power supply 222 and the impedance matching unit 225 in real time, transmits the impedance measured in real time to the impedance matching unit 225, and corrects total impedance $Z_T$ viewed from the RF power supply 222 to 50 Ω in real time. The impedance matching method will be described in order as follows.

The second sensor 225a in the impedance matching unit 225 measures a value of impedance $Z_L$ of the process chamber 100. Then, the impedance matching unit 225 performs primary impedance matching ($Z_M$) (i.e., first matching impedance) based on the measured value of the impedance $Z_L$. Thereafter, the first sensor 222a may measure the impedance $Z_T=Z_c+Z_M\neq50+j0$ viewed from the RF power supply 222 and transmit the measured value to the impedance matching unit 225. Through this, the impedance matching unit 225 may calculate impedance of a cable from a difference between $Z_M$ and $Z_T$, which have previously been subjected to the primary impedance matching, and correct (i.e., adjust) $Z_M$ by compensating for the impedance difference value of the cable (i.e., compensating for the cable impedance of the cable) to second matching impedance. In some embodiments, the cable impedance may be 50 ohms. However, the present inventive concept is not limited thereto. In some embodiments, the cable impedance may be 75 ohms.

The impedance matching method according to the present invention may achieve the following effects. In the present invention, the maximum power transmission condition may be satisfied by correcting inductance according to bending of the cable. Further, there is an effect in that Tool-To-Tool Matching (TTTM) that is correspondence between equipment is increased. In addition, Mean Time Between Cleans (MTBC) that is an equipment inspection cycle may be improved by correcting changes in impedance over time due to mechanical and thermal aging of the equipment and cables.

Further, it is possible to solve the problem that the length of a commercial cable does not fit the half-wavelength of the RF signal that is one of the existing problems. Further, it is possible to correct impedance deviation of the RF power supply 222, and there is an effect in that equipment setup and maintenance and repair time are reduced. Further, even when equipment, other than the cable, is inserted between the RF power supply 222 and the impedance matching unit 225, impedance matching may be possible, and it is possible to select various cable manufacturing companies. Further, it is easy to specify an abnormal part of the equipment by comparing impedance at the RF power supply 222 and the impedance matching unit 225.

In FIG. 7, the impedance matching method according to the exemplary embodiment has been described, but the impedance matching may be performed in a similar manner even in the case where the third sensor 225b is additionally included like the exemplary embodiment of FIG. 5. When the third sensor 225b is included, the third sensor 225b is capable of measuring impedance $Z_G+Z_C$ facing the RF power supply 222, so that it is possible to more accurately check the value of $Z_C$ by interworking impedance $Z_G+Z_C$ with the value of $Z_T=Z_c+Z_M$ measured by the first sensor 222a, and through this, it is possible to more accurately perform the impedance matching by performing secondary impedance matching.

Figure 8:
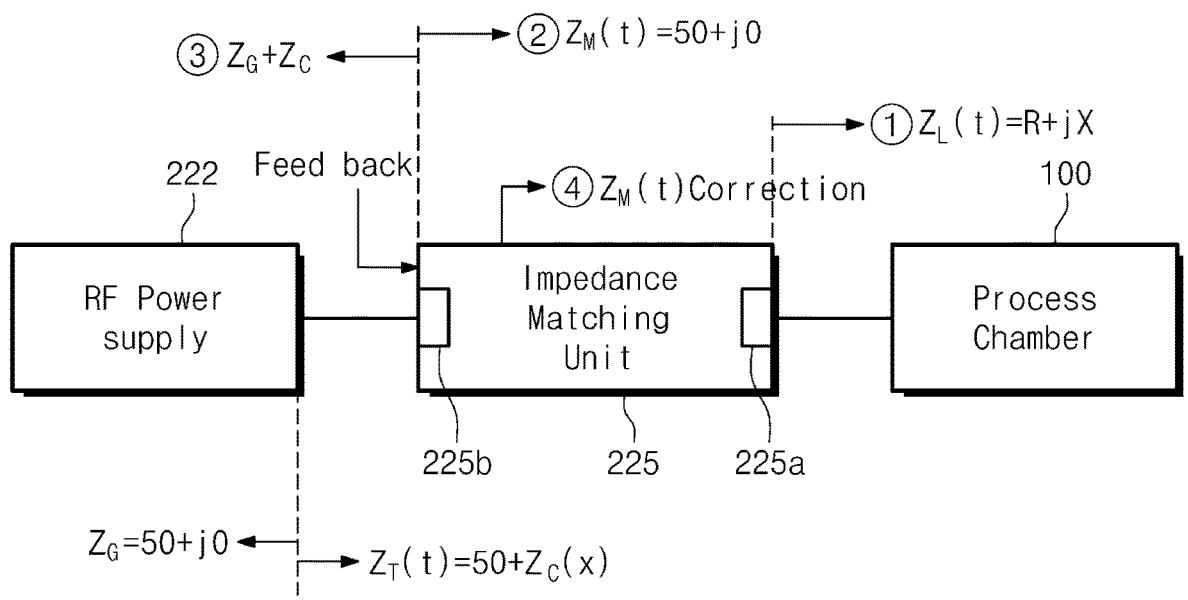
FIG. 8 is a diagram illustrating performance of impedance matching through the substrate treating apparatus according to the exemplary embodiment of FIG. 6.
Figure 9:
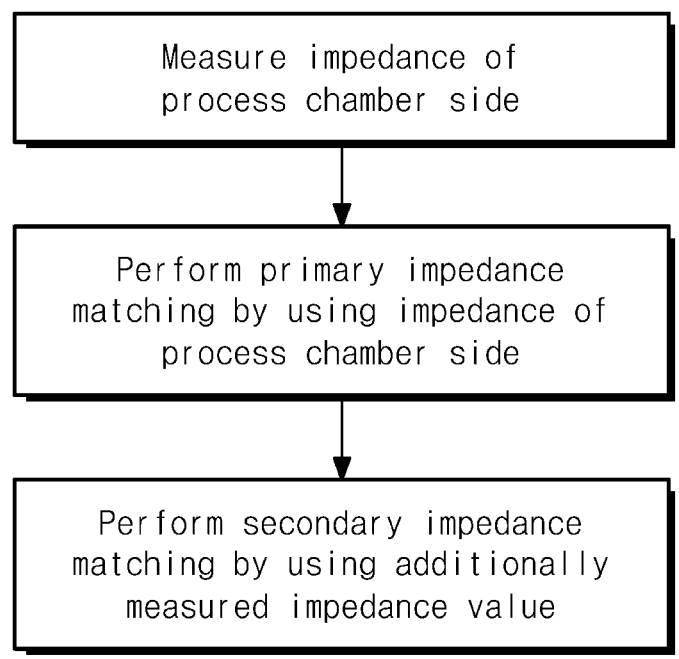
FIG. 9 is a flowchart illustrating an impedance matching method according to an exemplary embodiment of the present invention.

FIG. 8 is a diagram illustrating performance of impedance matching through the substrate treating apparatus according to the exemplary embodiment of FIG. 6.

The impedance matching methods according to the first exemplary embodiment and the second exemplary embodiment may accurately measure impedance, but there is a disadvantage in that the first sensor 222a needs to be additionally mounted to the RF power supply 222. In order to complement the disadvantage, the exemplary embodiment suggests a system utilizing only the second sensor 225a and the third sensor 225b in the impedance matching unit 225.

According to FIG. 8, the second sensor 225a of the impedance matching unit 225 measures chamber impedance $Z_L$. Then, the impedance matching unit 225 may perform primary impedance matching ($Z_M$). Then, the third sensor 225b may measure impedance $Z_G+Z_C$ facing the RF power supply 222. In this case, $Z_G$ may be measured in advance at the release stage of the equipment. According to one example, the value of $Z_G$ may be 50Ω. Cable impedance $Z_C$ may be calculated by considering the impedance 50Ω of the RF power supply 222 measured in advance in the measured impedance. The impedance matching unit 225 may correct $Z_M$ by considering the cable impedance $Z_C$ with the existing matched impedance $Z_M$.

FIG. 7 is a flowchart illustrating an impedance matching method according to an exemplary embodiment of the present invention.

Referring to FIG. 7, in the impedance matching method, the impedance matching unit 225 may measure impedance of the process chamber 100 side, perform primary impedance matching by using the impedance of the process chamber 100 side, and then perform secondary impedance matching by using an additionally measured impedance value.

The secondary impedance matching method may be different according to a mounting position of the sensor of the substrate treating apparatus.

According to the exemplary embodiment, the performing of the secondary impedance matching by using the additionally measured impedance value may include measuring an impedance value viewed from the RF power supply 222 by using the first sensor 222a. Then, the impedance matching may be performed so as to correct a difference between the impedance value $Z_c+Z_M$ viewed from the RF power supply 222 and the value of $Z_M$ in the primary impedance matching. The foregoing exemplary embodiment is the impedance matching method usable in the case where the RF power supply 222 includes the first sensor 222a.

According to another exemplary embodiment of the present invention, the performing of the secondary impedance matching by using the additionally measured impedance value may include measuring, by the impedance matching unit 225, an impedance value facing the RF power supply 222 by using the third sensor 225b. Then, the impedance matching unit 225 may calculate impedance of a cable connecting the impedance matching unit 225 and the RF power supply 222 by using the impedance value facing the RF power supply 222 and the previously measured impedance of the RF power supply 222, and perform the impedance matching by considering the calculated impedance value of the cable. Further, the impedance matching may be performed within the range satisfying the maximum power transmission condition $Z_C=Z_m$.

The foregoing exemplary embodiments are presented for helping the understanding of the present invention, and do not limit the scope of the present invention, and it should be understood that various modified exemplary embodiments from the foregoing exemplary embodiments are also included in the scope of the present invention. The drawings provided in the present invention only show the optimum exemplary embodiment of the present invention. The technical scope of the present invention will be defined by the technical spirit of the accompanying claims, and it should be understood that the technical sprit of the present invention is not limited to the literal description of the claims itself, but substantially extends to the invention of an equivalent scope of the technical value.

What is claimed is:

1. An apparatus for treating a substrate, the apparatus comprising:
    an RF (radio frequency) power supply;
    a process chamber configured to contain plasma generated by using power applied from the RF power supply;
    an impedance matching unit disposed between the RF power supply and the process chamber and configured to perform impedance matching between the RF power supply and the process chamber containing the plasma;
    wherein the RF power supply includes a first sensor configured to measure a first impedance in a direction of the process chamber and the impedance matching unit,
    wherein the impedance matching unit performs the impedance matching by reflecting the first impedance measured in the RF power supply through the first sensor,
    wherein the impedance matching unit includes a second sensor measuring a second impedance in a direction of the process chamber, and
    wherein the impedance matching unit performs the impedance matching by further reflecting the second impedance; and
    a cable connecting the RF power supply and the impedance matching unit with each other,
    wherein the impedance matching unit is configured to:
        perform primary impedance matching by using the second impedance measured by the second sensor so that the impedance matching unit has a first matching impedance;
        calculate an impedance of the cable from a difference between the first matching impedance and the first impedance measured by the first sensor; and
        perform secondary impedance matching based on the calculated impedance of the cable so that the first matching impedance of the impedance matching unit is adjusted to a second matching impedance.

2. The apparatus of claim 1,
    wherein the impedance matching unit includes a third sensor measuring a third impedance in a direction of the RF power supply, and
    wherein the impedance matching unit performs the impedance matching by further reflecting the third impedance.

3. The apparatus of claim 1,
    wherein the impedance matching unit performs the impedance matching to transfer a maximum power to the process chamber.

4. The apparatus of claim 3,
    wherein the RF power supply is provided in plurality, and
    wherein the impedance matching unit performs the matching between each of the plurality of RF power supplies and the process chamber.

5. An apparatus for treating a substrate, the apparatus comprising:
    an RF power supply;
    a process chamber configured to contain plasma generated by using power applied from the RF power supply;
    an impedance matching unit disposed between the RF power supply and the process chamber and configured to perform impedance matching between the RF power supply and the process chamber containing the plasma; and
    a cable connecting the RF power supply and the impedance matching unit with each other,
    wherein the impedance matching unit includes:
        a second sensor configured to measure impedance in a direction of the process chamber; and
        a third sensor configured to measure impedance in a direction of the RF power supply,
    wherein the impedance matching unit is configured to:
        perform primary impedance matching by using the impedance measured by the second sensor so that the impedance matching unit is set to first matching impedance;
        calculate an impedance of the cable using the impedance measured by the second sensor; and
        perform secondary impedance matching based on the calculated impedance of the cable so that the first matching impedance of the impedance matching unit is adjusted to second matching impedance.

6. The apparatus of claim 5:
    wherein the impedance matching unit is configured to calculate impedance of the cable based on the impedance measured by the third sensor and the first matching impedance of the RF power supply which was set in the primary impedance matching.

7. The apparatus of claim 6,
    wherein the secondary impedance matching is performed by considering the impedance of the cable.

8. The apparatus of claim 5,
wherein the impedance matching unit performs the impedance matching in a range satisfying a maximum power transmission condition.

9. The apparatus of claim 8,
wherein the RF power supply is provided in plurality, and
wherein the impedance matching unit performs the matching between each of the plurality of RF power supplies and the process chamber.

10. An apparatus for treating a substrate, the apparatus comprising:
an RF (radio frequency) power supply;
a process chamber configured to contain plasma generated by using power applied from the RF power supply;
an impedance matching unit disposed between the RF power supply and the process chamber and configured to perform impedance matching between the RF power supply and the process chamber containing the plasma,
wherein the RF power supply includes a first sensor configured to measure a first impedance in a direction of the process chamber and the impedance matching unit, wherein the impedance matching unit performs the impedance matching by reflecting the first impedance measured in the RF power supply through the first sensor, wherein the impedance matching unit includes a second sensor measuring a second impedance in a direction of the process chamber, wherein the impedance matching unit performs the impedance matching by further reflecting the second impedance, wherein the impedance matching unit includes a third sensor measuring a third impedance in a direction of the RF power supply, and wherein the impedance matching unit performs the impedance matching by further reflecting the third impedance; and
a cable connecting the RF power supply and the impedance matching unit with each other,
wherein the impedance matching unit is configured to:
perform primary impedance matching by using the second impedance measured by the second sensor so that the impedance matching unit has a first matching impedance; and
perform secondary impedance matching to compensate for cable impedance by using the first impedance measured by the first sensor and the third impedance measured by the third sensor so that the first matching impedance of the impedance matching unit is adjusted to a second matching impedance.

* * * * *